US009941226B2

(12) United States Patent
Tsai et al.

(10) Patent No.: US 9,941,226 B2
(45) Date of Patent: Apr. 10, 2018

(54) INTEGRATED MILLIMETER-WAVE CHIP PACKAGE

(71) Applicant: Industrial Technology Research Institute, Hsinchu (TW)

(72) Inventors: Cheng-Hua Tsai, New Taipei (TW); Shyh-Jong Chung, Hsinchu (TW); Ching-Kuan Lee, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 274 days.

(21) Appl. No.: 14/569,791

(22) Filed: Dec. 15, 2014

(65) Prior Publication Data

US 2016/0172317 A1   Jun. 16, 2016

(51) Int. Cl.
*H01L 23/66*   (2006.01)
*H01L 25/03*   (2006.01)
(Continued)

(52) U.S. Cl.
CPC ........ *H01L 23/66* (2013.01); *H01L 23/49827* (2013.01); *H01L 23/49833* (2013.01); *H01L 23/552* (2013.01); *H01L 24/33* (2013.01); *H01L 24/73* (2013.01); *H01L 23/13* (2013.01); *H01L 23/49811* (2013.01); *H01L 23/49838* (2013.01); *H01L 24/13* (2013.01); *H01L 24/16* (2013.01);
(Continued)

(58) Field of Classification Search
CPC ..... H01L 23/66; H01L 23/5384; H01L 24/17; H01L 24/19; H01L 24/24; H01L 25/03; H01L 24/29; H01L 24/32; H01L 24/83; H01L 24/18; H01L 23/49811; H01L 23/3128; H01L 23/552; H05K 1/185; H05K 1/0243; H01Q 1/38; H01Q 1/2283
USPC ....... 257/428, 724, 713, 738, 659, 660, 728; 438/643, 487, 655, 768, 686
See application file for complete search history.

(56) References Cited

U.S. PATENT DOCUMENTS 6,770,955 B1 *   8/2004   Coccioli ............. H01L 23/3128
                                                              257/659
7,102,520 B2     9/2006   Liu et al.
(Continued)

FOREIGN PATENT DOCUMENTS

CN   101996979   3/2011
CN   102543927   7/2012
(Continued)

OTHER PUBLICATIONS

"Office Action of Taiwan Counterpart Application", dated Jun. 27, 2016, p. 1-p. 7, in which the listed references were cited.
(Continued)

*Primary Examiner* — Mouloucoulaye Inoussa
(74) *Attorney, Agent, or Firm* — JCIPRNET (57) ABSTRACT

An integrated millimeter-wave chip package structure including an interposer structure, a millimeter-wave chip and a substrate is provided. The interposer structure includes at least an antenna pattern and at least a plated through-hole structure penetrating through the interposer structure and connected to the at least one antenna pattern. The millimeter-wave chip is electrically connected to the at least antenna pattern located either above or below the millimeter-wave chip through the at least plated through-hole structure.

15 Claims, 5 Drawing Sheets

(51) Int. Cl.
*H01L 23/552* (2006.01)
*H01L 23/13* (2006.01)
*H01L 23/498* (2006.01)
*H01L 23/00* (2006.01)

(52) U.S. Cl.
CPC .............. *H01L 24/29* (2013.01); *H01L 24/32* (2013.01); *H01L 24/83* (2013.01); *H01L 2223/6677* (2013.01); *H01L 2223/6683* (2013.01); *H01L 2224/131* (2013.01); *H01L 2224/13144* (2013.01); *H01L 2224/16227* (2013.01); *H01L 2224/16235* (2013.01); *H01L 2224/2919* (2013.01); *H01L 2224/32013* (2013.01); *H01L 2224/32104* (2013.01); *H01L 2224/32105* (2013.01); *H01L 2224/32106* (2013.01); *H01L 2224/32225* (2013.01); *H01L 2224/32237* (2013.01); *H01L 2224/33181* (2013.01); *H01L 2224/73204* (2013.01); *H01L 2224/73253* (2013.01); *H01L 2224/83104* (2013.01); *H01L 2224/92125* (2013.01); *H01L 2924/1421* (2013.01); *H01L 2924/1423* (2013.01); *H01L 2924/15151* (2013.01); *H01L 2924/15153* (2013.01); *H01L 2924/15321* (2013.01); *H01L 2924/15331* (2013.01)

(56) References Cited

U.S. PATENT DOCUMENTS

| | | | |
|---|---|---|---|
| 7,592,202 | B2 | 9/2009 | Toyama et al. |
| 8,143,097 | B2 | 3/2012 | Chi et al. |
| 8,339,233 | B2 | 12/2012 | Tsai et al. |
| 8,536,695 | B2 | 9/2013 | Liu et al. |
| 2004/0168825 | A1* | 9/2004 | Sakamoto ........... H01L 21/4846 174/260 |
| 2005/0035924 | A1 | 2/2005 | Liu et al. |
| 2006/0097906 | A1* | 5/2006 | Heide ..................... G01S 7/032 342/22 |
| 2009/0008765 | A1* | 1/2009 | Yamano ................. H01L 24/83 257/690 |
| 2011/0032685 | A1 | 2/2011 | Akiba et al. |
| 2011/0102282 | A1 | 5/2011 | Liu et al. |
| 2012/0119969 | A1 | 5/2012 | MacDonald et al. |
| 2013/0027274 | A1 | 1/2013 | Carpentier et al. |
| 2013/0141284 | A1* | 6/2013 | Jeong ..................... H01Q 1/38 343/700 MS |

FOREIGN PATENT DOCUMENTS

| | | |
|---|---|---|
| CN | 103400829 | 11/2013 |
| TW | I418269 | 12/2013 |
| TW | 201407745 | 2/2014 |
| TW | 201436361 | 9/2014 |

OTHER PUBLICATIONS

Pouya Talebbeydokhti, et al., "Low Cost BT Organic Material for Wireless 60 GHz Application," 2013 IEEE 63rd Electronic Components and Technology Conference (ECTC), May 28-31, 2013, pp. 1634-1639.

Duixian Liu, et al., "Packages With Integrated 60-GHz Aperture-Coupled Patch Antennas," IEEE Transactions on Antennas and Propagation, vol. 59, No. 10, Oct. 2011, pp. 3607-3616.

Xiaoxiong Gu, et al., "Enhanced Multilayer Organic Packages with Embedded Phased-Array Antennas for 60-GHz Wireless Communications," 2013 IEEE 63rd Electronic Components and Technology Conference (ECIC), May 28-31, 2013, pp. 1650-1655.

N. Hoivik, et al., "High-Efficiency 60 GHz Antenna Fabricated Using Low-Cost Silicon Micromachining Techniques," 2007 IEEE Antennas and Propagation Society International Symposium, Jun. 9-15, 2007, pp. 5043-5046.

Dong Gun Kam, et al., "Low-Cost Antenna-in-Package Solutions for 60-GHz Phased-Array Systems," 2010 IEEE 19th Conference on Electrical Performance of Electronic Packaging and Systems (EPEPS), Oct. 25-27, 2010, pp. 93-96.

Mei Sun, et al., "A Ball Grid Array Package With a Microstrip Grid Array Antenna for a Single-Chip 60-GHz Receiver," IEEE Transactions on Antennas and Propagation, vol. 59, No. 6, Jun. 2011, pp. 2134-2140.

Ajay Balankutty, et al, "A 12-Element 60GHz CMOS Phased Array Transmitter on LTCC Package with Integrated Antennas," IEEE Asian Solid-State Circuits Conference, Nov. 14-16, 2011, pp. 273-276.

Amin Enayati, et al., "Millimeter-Wave Horn-Type Antenna-in-Package Solution Fabricated in a Teflon-Based Multilayer PCB Technology," IEEE Transactions on Antennas and Propagation, vol. 61, No. 4, Apr. 2013, pp. 1581-1590.

Wasif Tanveer Khan, et al., "Packaging a W-Band Integrated Module With an Optimized Flip-Chip Interconnect on an Organic Substrate," IEEE Transactions on Microwave Theory and Techniques, vol. 62, No. 1, Jan. 2014, pp. 64-72.

Behzad Biglarbegian, et al., "Integrated Microstrip-Fed Slot Array Antenna for Emerging Wireless Application in IPD Technology," 2011 IEEE MTT-S International Microwave Workshop Series on Millimeter Wave Integration Technologies (IMWS), Sep. 15-16, 2011, pp. 41-44.

* cited by examiner

INTEGRATED MILLIMETER-WAVE CHIP PACKAGE

TECHNICAL FIELD

The disclosure generally relates to a package structure, and particularly relates to an integrated millimeter-wave chip package structure.

BACKGROUND

Ever since the application of wireless receivers recently becomes the focus in the Consumer Electronics Show, it declares the coming of Wireless Gigabit Alliance (WiGi) and wireless high-definition (HD) standard applications. Although many manufacturers have developed chips of the millimeter-wave band (millimeter-wave chips), there is no comprehensive solution regarding the package for the chips of the millimeter-wave band.

Traditional wire-bonding packages are not suitable for packaging millimeter-wave chips. However, for the low temperature co-fired ceramic (LTCC) and flip-chip packages, because of the substrate shrinkage caused by the process conditions and low process efficiency as well as very small pad sizes and pitches for the chips to be packaged, the yield of the package is unsatisfactory. It is advantageous to develop an integrated package of the antenna and millimeter-wave chip.

SUMMARY

The disclosure provides an integrated antenna package structure incorporating the millimeter-wave chip(s) and the antenna pattern(s). By arranging the position of the antenna pattern(s) vertically aligned with the position of the millimeter-wave chip(s), the upright electrical connection structures electrically connect the millimeter-wave chip(s) with the antenna pattern(s) located at different layers of the package structure vertically, which shortens the signal transmission path and reduces the signal transmission loss.

The embodiment of the disclosure provides an integrated millimeter-wave chip package structure including at least one interposer structure, at least one chip and at least one substrate. The interposer structure includes a first metal layer, a second metal layer and an insulating support layer located between the first and second metal layers, and the interposer structure includes at least one first plated through-hole structure penetrating through the first metal layer, the insulating support layer and the second metal layer and electrically connecting the first metal layer and second metal layer. The at least one chip is coupled to the first interposer structure. The at least one chip has an active surface and contact pads located in the active surface of the at least one chip. The substrate is coupled to the interposer structure. The substrate includes at least one insulating layer and a third metal layer located on the at last one insulating layer. The third metal layer is located on one side of the substrate facing the interposer structure. The first metal layer of the interposer structure comprises at least one antenna pattern, and the at least one antenna pattern is located above or below the at least one chip. The at least one chip is electrically connected to the at least one antenna pattern through the at least one first plated through-hole structure of the first interposer structure.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The millimeter-wave region of the electromagnetic spectrum is usually considered to be the range of wavelengths from 1 millimeter to 10 millimeters, or converted as the range of frequencies from 30 GHz to 300 GHz. Therefore, the millimeter-wave chip means the chip operated in the wavelength range of millimeter-waves as a radio frequency transmitter and/or transceiver chip. The similar or identical elements and parts recited in following exemplary embodiments may be labelled with the same reference numerals. The descriptions regarding the sequence, order or the relative positions of above, below/beneath are merely for illustrative purposes, but are not intended to further limit its relative position or range.

Figure 1:
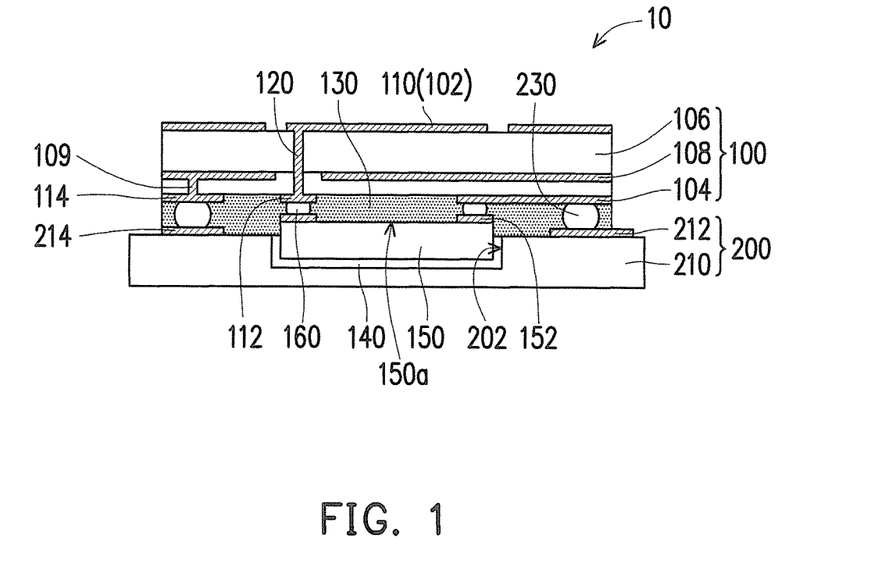
FIG. 1 is a schematic cross-sectional view of an integrated millimeter-wave chip package structure according to an embodiment of the disclosure.

FIG. 1 is a schematic cross-sectional view of an integrated millimeter-wave chip package structure according to an embodiment of the disclosure.

Referring to FIG. 1, the integrated millimeter-wave chip package structure 10 includes an interposer structure 100, a millimeter-wave chip 150 and a substrate 200. The interposer structure 100 includes a first metal layer 102, a second metal layer 104, an insulating support layer 106 located between the first and second metal layers 102/104, and at least one plated through-hole structure 120. The plated through-hole structure 120 penetrates through the interposer structure 100 (through the first metal layer 102, the insulating support layer 106 and the second metal layer 104) and electrically connects the second metal layer 104 and the first metal layer 102. The first metal layer 102 includes at least an antenna pattern 110. The second metal layer 104 may be a wiring layer including a plurality of pads 112 and 114. The plated through-hole structure 120 may be formed by forming a through-hole by etching or laser drilling and then forming a plated through-hole structure by electroplating.

Compared to the conventional package structure using wires or wiring for connecting the antenna pattern, the integrated millimeter-wave chip package structure of the present disclosure utilizes the plated through-hole structure to electrically connect the antenna pattern and to feed the signal to the antenna.

Referring to FIG. 1, the interposer structure 100 further includes a wiring layer 108 and a metal filled via structure 109. The wiring layer 108 is located in the insulating support layer 106 and is located between the antenna pattern 110 and the second metal layer 104. The metal filled via structure 109 is located between the wiring layer 108 and the pads 114 and electrically connects the wiring layer 108 and the pad 114. The wiring layer 108 is not connected to the plated through-hole structure 120. The wiring layer 108 can be used as a ground layer, and the ground layer also has the function of shielding the millimeter-wave chip 150 from excessive electromagnetic interference (EMI), without unduly affecting the operation of the integrated millimeter-wave chip package structure of the disclosure. The package structure of the disclosure is not limited to include single wiring layer, and the package structure may include more than one wiring layer to integrate more elements or to make the design of the wiring more flexible.

The substrate 200 includes at least one insulating layer 210 and a third metal layer 212 located on the insulating layer 210. The third metal layer 212 is located on one side of the substrate 200 facing the second metal layer 104 and the third metal layer 212 includes a plurality pad 214. The substrate 200 has a concave cavity 202, and the millimeter-wave chip 150 is buried in the concave cavity 202 and fixed to the concave cavity 202 of the substrate 200 through an adhesive layer 140. Optionally, the adhesive layer 140 may be omitted. The millimeter-wave chip 150 has an active surface 150a and contact pads 152 located on the active surface 150a of the chip 150. The millimeter-wave chip 150 is embedded in the concave cavity 202, and its active surface 150a faces the second metal layer 104 of the interposer structure 100. Through the bumps 160 or solder balls or gold balls located between the second metal layer 104 and the contact pads 152, the contact pads 152 of the millimeter-wave chip 150 and the second metal layer 104 (the pad 112) are electrically connected. In addition, the antenna pattern 110 is electrically connected with the millimeter-wave chip 150 through the plated through-hole structure 120 and the bumps 160 (via the pad 112 and the contact pad 152). Herein, the substrate 200 may be, for example, a printed circuit board or a ceramic substrate.

Referring to FIG. 1, the antenna pattern 110 may be located above the millimeter-wave chip 150. Herein, whether it is described to be located "above" or "below" in the texts, it is understood by the artisan in this area that the relative position depends on the placement direction of this package and the position of the antenna pattern is aligned with the position of the chip. The distribution area of the antenna pattern 110 can be equal to or greater than the size of a chip, but the positions of both are completely or partially aligned with each other.

Referring to FIG. 1, the interposer structure 100 is laminated over the substrate 200, through the bumps 230 or solder balls or gold balls located between the second metal layer 104 (the pads 114) and the third metal layer 212 (the pads 214), the second metal layer 104 of the interposer structure 100 is electrically connected with the third metal layer 212. An underfill layer 130 is disposed between the interposer structure 100 and the substrate 200 to facilitate the adhesion between the bumps, the interposer structure 100 and the substrate 200. That is, the millimeter-wave chip 150 and the substrate 200 are electrically connected through bumps 160 located between the pads 114 of the second metal layer 104 and the millimeter-wave chip 150 and the bumps 230 located between the second metal layer 104 and the third metal layer 212 for electrical connection.

In FIG. 1, for the integrated millimeter-wave chip package structure 10, the antenna pattern 110 in FIG. 1 is disposed above the millimeter-wave chip 150, and the antenna pattern 110 is electrically connected with the millimeter-wave chip 150 through the plated through-hole structure 120. For such vertically integrated millimeter-wave chip package structure 10, the signal transmission distance between the antenna pattern 110 and the millimeter-wave chip 150 can be significantly reduced, instead of using wire-bonding technology.

Figure 2:
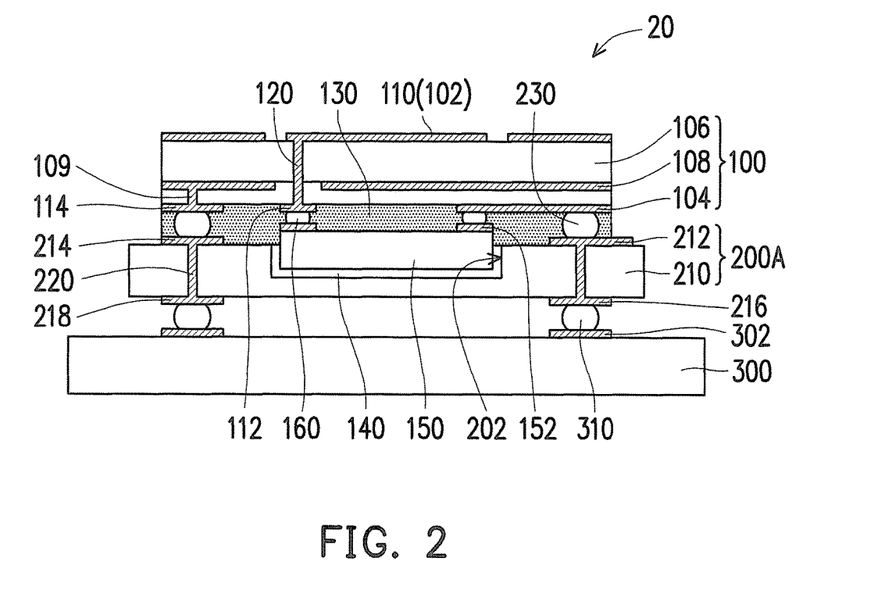
FIG. 2 is a schematic cross-sectional view of an integrated millimeter-wave chip package structure according to another embodiment of the disclosure.

FIG. 2 is a schematic cross-sectional view of an integrated millimeter-wave chip package structure according to another embodiment of the disclosure. Referring to FIG. 2, the integrated millimeter-wave chip package 20 includes the interposer structure 100, the millimeter-wave chip 150, a substrate 200A and another substrate 300. Herein, in addition to the same interposer structure 100, the substrate 200A in FIG. 2 is quite similar to the substrate 200 in FIG. 1, but the substrate 200A includes an insulating layer 210 and the third metal layer 212 and fourth metal layer 216 respectively located on both sides of the insulating layer 210. The third metal layer 212 includes a plurality of pads 214, and the fourth metal layer 216 includes a plurality of pads 218. In addition, the substrate 200A further includes a plated through-hole structure 220 penetrating through the substrate 200A and connecting the third metal layer 212 and the fourth metal layer 216 on both sides of the insulating layer 210.

The substrate 300 comprises solder balls 310 disposed on the pads 302. Through the solder balls 310 on the pads 302 and the pads 218 of the substrate 200A, the substrate 300 and the substrate 200A are physically and electrically connected. Herein, the substrate 200A may be, for example, a carrier substrate, and the substrate 300 may be a printed circuit board. Through the bumps 160, 230 and solder balls 310, the millimeter-wave chip 150 may be electrically connected to the printed circuit board.

Figure 3:
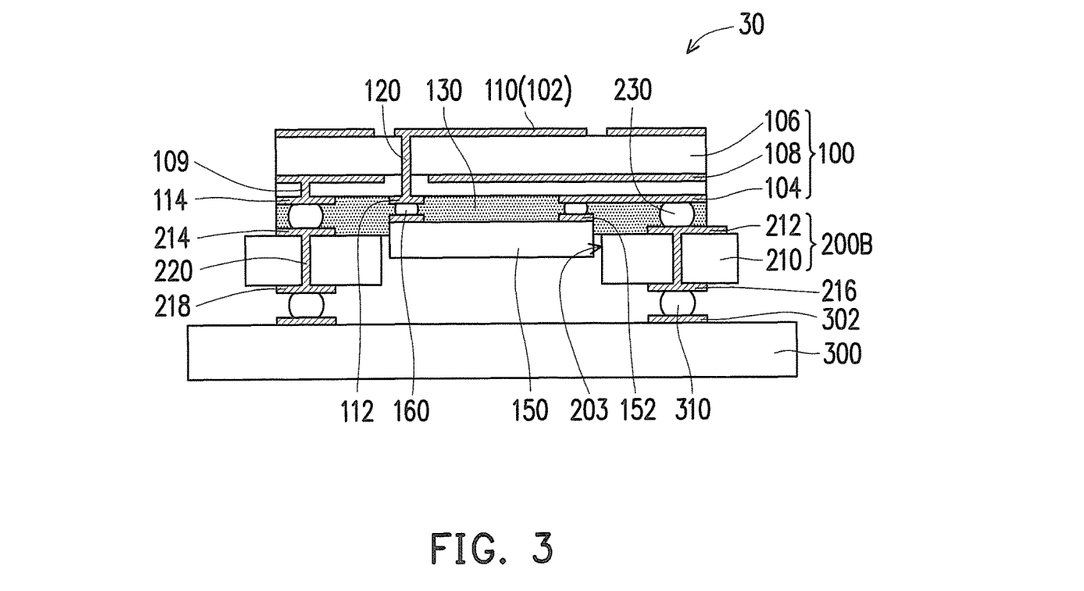
FIG. 3 is a schematic cross-sectional view of an integrated millimeter-wave chip package structure according to another embodiment of the disclosure.

FIG. 3 is a schematic cross-sectional view of an integrated millimeter-wave chip package structure according to yet another embodiment of the disclosure. Referring to FIG. 3, the integrated millimeter-wave chip package 30 includes the interposer structure 100, the millimeter-wave chip 150, a substrate 200B and another substrate 300. Herein the substrate 200B and the substrate 200A are quite similar, except for the substrate 200A having a concave cavity. The substrate 200B has an opening 203 exposing the millimeter-wave chip 150, and the millimeter-wave chip 150 is physically connected to the interposer structure 100 through the bumps 160 located between the second metal layer 104 and the contact pads 152 of the chip. The antenna pattern 110 of the integrated millimeter-wave chip package 30 is disposed above the millimeter-wave chip 150 and the antenna pattern 110 is electrically connected to the millimeter-wave chip 150 through the plated through-hole structure 120 so as to vertically integrate the millimeter-wave chip and the antenna pattern of the package structure 30, thereby shortening signal transmission distance between the antenna pattern 110 and the millimeter-wave chip 150.

Figure 4:
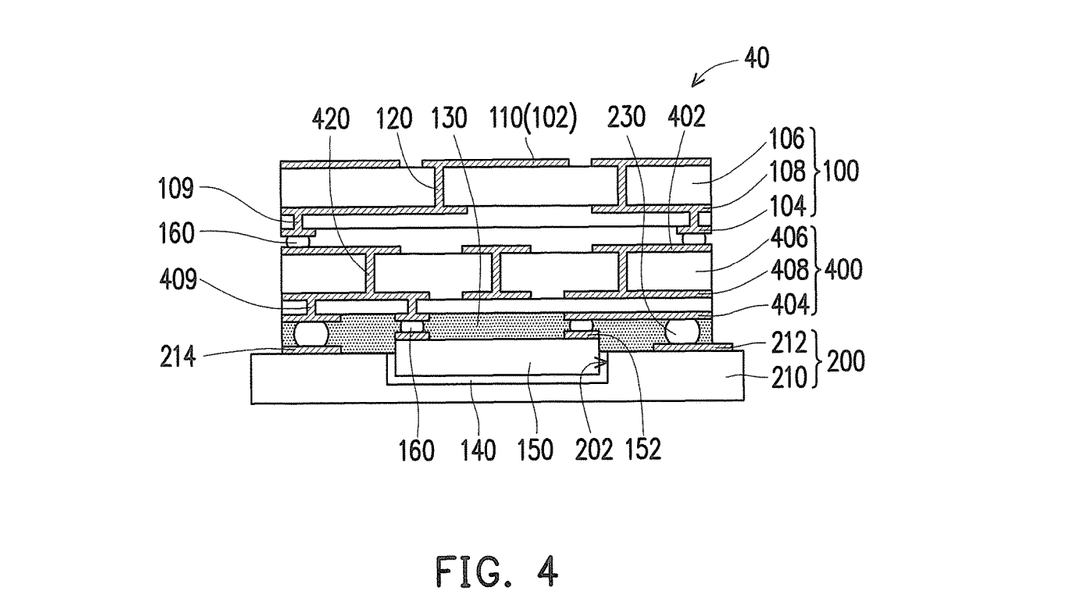
FIG. 4 is a schematic cross-sectional view of an integrated millimeter-wave chip package structure according to another embodiment of the disclosure.

FIG. 4 is a schematic cross-sectional view of an integrated millimeter-wave chip package structure according to another embodiment of the disclosure. Referring to FIG. 4, the integrated millimeter-wave chip package 40 includes the interposer structure 100, the millimeter-wave chip 150, the substrate 200 and another interposer structure 400. Herein, the interposer structure 100 and the substrate 200 are similar to those shown in FIG. 1, the integrated millimeter-wave chip package structure 40 comprises another interposer structure 400 positioned between the substrate 200 and the interposer structure 100. The interposer structure 400 connects with the upper interposer structure 100 and the underlying substrate 200 through the bumps 160 and 230. The interposer structure 400 is quite similar to the interposer structure 100 in FIG. 1, and the interposer structure 400 includes an upper metal layer 402, a lower metal layer 404, an insulating support layer 406 located between the upper and lower metal layers 402, 404, a wiring layer 408, metal filled via structures 409 and at least one plated through-hole structure 420. The upper metal layer 402 of the interposer structure 400 may be a circuit layer and may include one or more antenna patterns, depending on the product design. The lower metal layer 404 may be a circuit layer and comprises a plurality of pads. The interposer structure 400, through the bumps 160, 230, is electrically connected with the interposer structure 100, the millimeter-wave chip 150 and the substrate 200. By way of the bumps 160 and the metal filled via structures 409 as well as the plated through-hole structures 120, 420, the antenna pattern 110 and the millimeter-wave chip 150 are electrically connected. The millimeter-wave chip package structure 40 of FIG. 4 includes another interposer structure 400 to integrate additional passive components or antenna pattern or the matching circuitry into the package structure.

Figure 5:
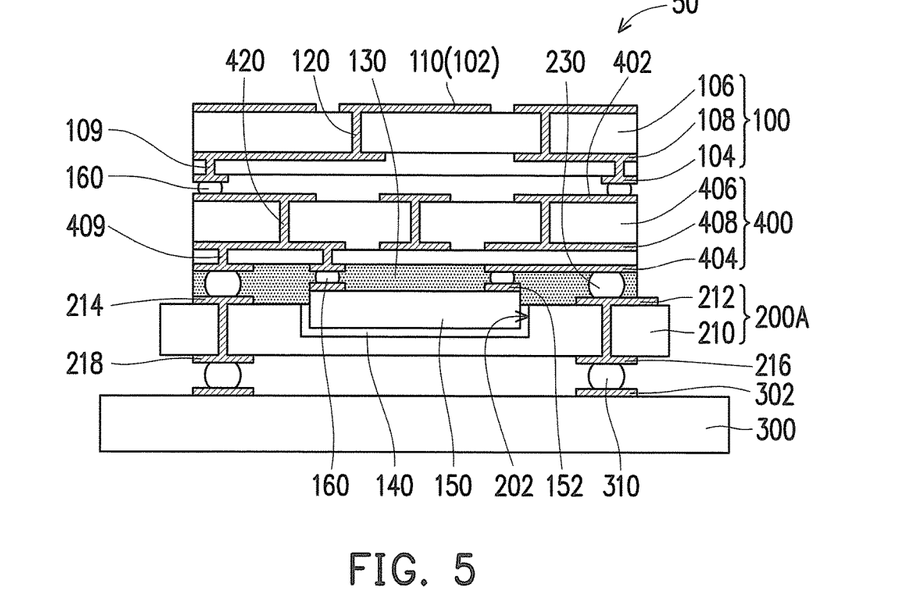
FIG. 5 is a schematic cross-sectional view of an integrated millimeter-wave chip package structure according to another embodiment of the disclosure.

FIG. 5 is a schematic cross-sectional view of an integrated millimeter-wave chip package structure according to another embodiment of the disclosure. Referring to FIG. 5, the integrated millimeter-wave chip package structure 50 includes the interposer structure 100, the millimeter-wave chip 150, the substrate 200A, the substrate 300 and another interposer structure 400. Herein, the integrated millimeter-wave chip package structure 50 is quite similar to the integrated millimeter-wave chip package structure 20, except for having the additional interposer structure 400 located between the substrate 200A and the interposer structure 100 of the integrated millimeter-wave chip package structure 50. The interposer structure 400 connects with the upper interposer structure 100 and the underlying substrate 200A through the bumps 160 and 230. Similarly, through the solder balls 310 located on the pads 302, the substrate 200A and the substrate 300 are physically and electrically connected. Herein, the substrate 200A may be, for example, a carrier substrate, and the substrate 300 may be a printed circuit board. Through the bumps 160, 230 and the solder balls 310, the millimeter-wave chip 150 is electrically connected to the printed circuit board.

Figure 6:
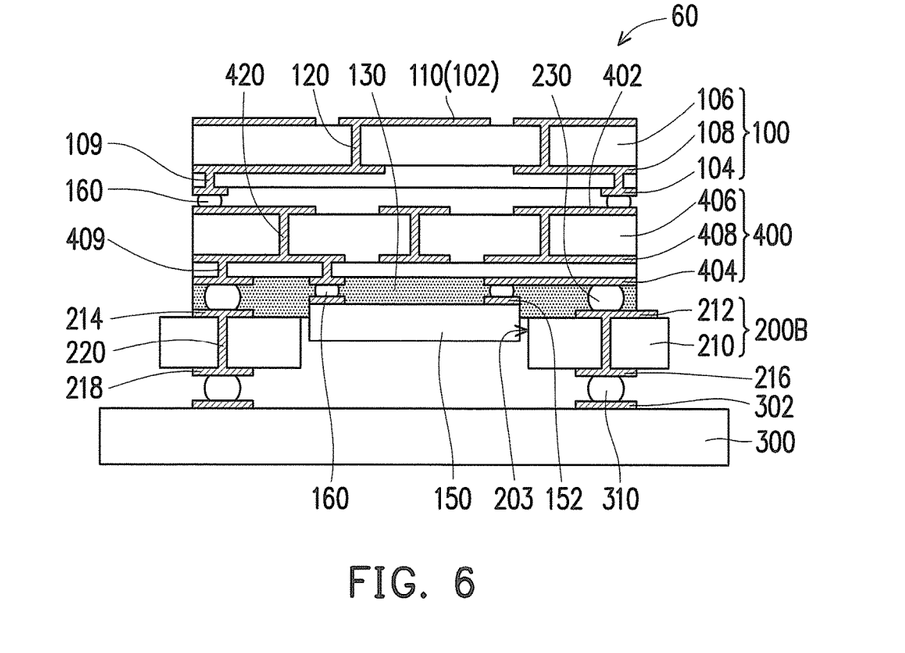
FIG. 6 is a schematic cross-sectional view of an integrated millimeter-wave chip package structure according to another embodiment of the disclosure.

FIG. 5 is a schematic cross-sectional view of an integrated millimeter-wave chip package structure according to another embodiment of the disclosure. Referring to FIG. 6, the integrated millimeter-wave chip package structure 60 includes the interposer structure 100, the millimeter-wave chip 150, the substrate 200B, the substrate 300 and another interposer structure 400. Herein, the integrated millimeter-wave chip package structure 60 is quite similar to the integrated millimeter-wave chip package structure 50, the substrate 200A of the millimeter-wave chip package substrate 50 has the concave cavity, but the substrate 200B of the millimeter-wave chip package structure 60 has an opening 203 to expose the millimeter-wave chip 150. The millimeter-wave chips 150 are physically connected with the interposer structure 400 through the bumps 160. For the integrated millimeter-wave chip package 60, the antenna pattern 110 is disposed above the millimeter-wave chip 150, and the antenna pattern 110 and the millimeter-wave chip 150 are electrically connected through the bumps 160 as well as the plated through-hole structures 120 and 420, so as to vertically integrate the millimeter-wave chip and the antenna pattern of the package structure 60.

Figure 7:
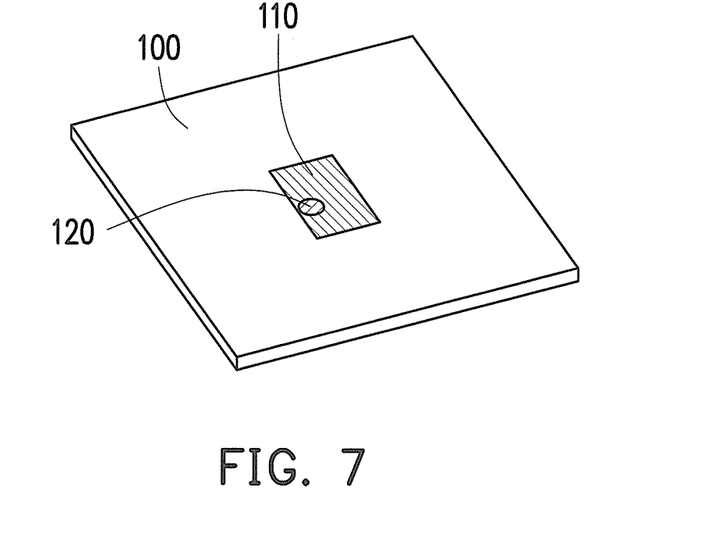
FIG. 7 is a partial top view of an integrated millimeter-wave chip package structure in accordance with one embodiment of the disclosure.

FIG. 7 may be regarded as the schematic partial top view of the antenna pattern 110 of FIG. 1 or FIG. 3. Referring to FIG. 7, the antenna pattern 110 is directly connected with the underlying plated through-hole structure 120 to vertically feed in the signal. As the electrical connection structure (i.e. plated through-hole structure 120) is arranged below and at a different layer from the antenna pattern, the layout area required for the antenna pattern is smaller.

Figure 8:
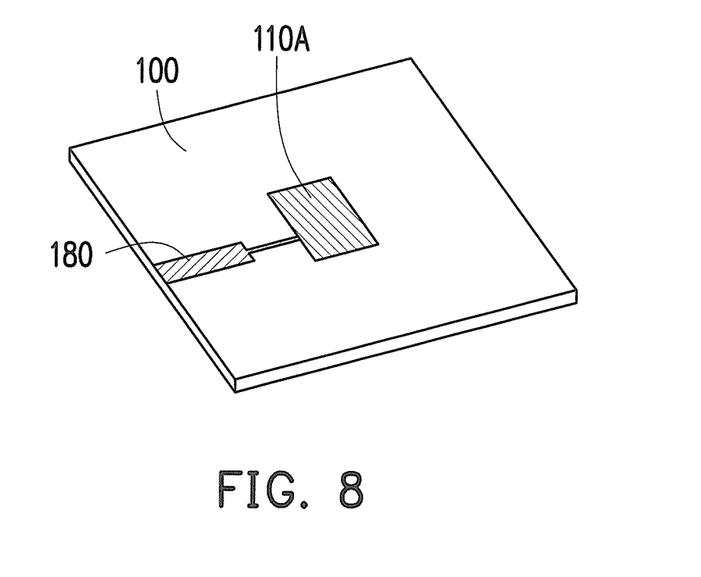
FIG. 8 is a partial top view of another integrated millimeter-wave chip package structure in accordance with another embodiment of the disclosure.

FIG. 8 is a schematic partial top view of another millimeter-wave chip package structure. With respect to the antenna pattern 110 of FIG. 7 being directly connected with the plated through-hole structure 120, the antenna pattern 110A of FIG. 8 is designed to use the wiring 180 arranged coplanar and lateral to the antenna pattern 110A to laterally feed in the signal.

In foregoing embodiments of the present disclosure, although single chip or one antenna pattern is described, but the scope of the present disclosure is not limited thereto. The integrated chip package structure can be configured with a plurality of chips or a plurality of antenna patterns. In the embodiments, the millimeter-wave chip 150 may be a radio frequency chip, and the material of the first, second, third or fourth metal layer may include aluminum, copper, nickel, gold or silver or the combinations thereof. The antenna pattern may be a radio frequency antenna pattern, such as a patch antenna or preferably the antenna pattern of 60 GHz frequency band.

In the embodiment, the integrated millimeter-wave chip package structure utilizes the interposer structure having the plated through-hole structure therein, so as to electrically connect the antenna pattern and the underlying chip. Therefore, without using the wires or the wiring for electrical connection and feeding in signals, a smaller layout area is required to form an antenna pattern.

Figure 9:
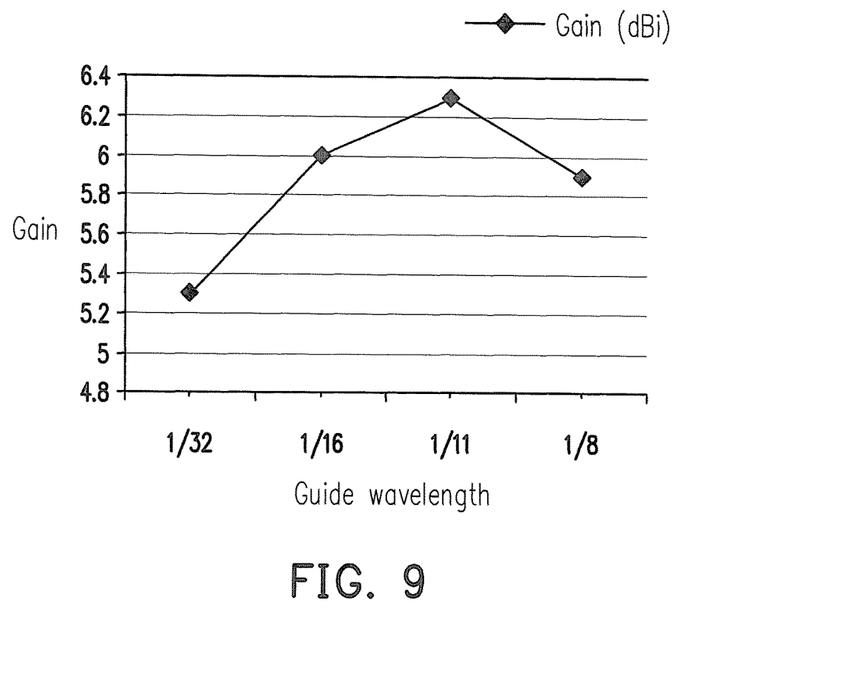
FIG. 9 is a graph showing the relationship of the gain of the millimeter-wave antenna versus the length of the through-hole for guide wavelength.

In summary, the present disclosure may use plated through-hole structure(s) for electrically connection and for signal feed-in. The disclosure using the plated through-hole structure(s) for signal feed-in occupies smaller layout area, as compared to the antenna fed by wires or wirings. FIG. 9 is a graph showing the relationship of the gain of the millimeter-wave antenna versus the length of the through-hole, using 60 GHz patch antenna. According to the figure, the length of the through-hole ranges from one eighth of the guide wavelength to one sixteenth of the guide wavelength. Based on the package structure of the embodiments, when the length of the through-hole is about one eleventh of the guide wavelength, a gain of the antenna being 6.3 dBi is observed.

Figure 10:
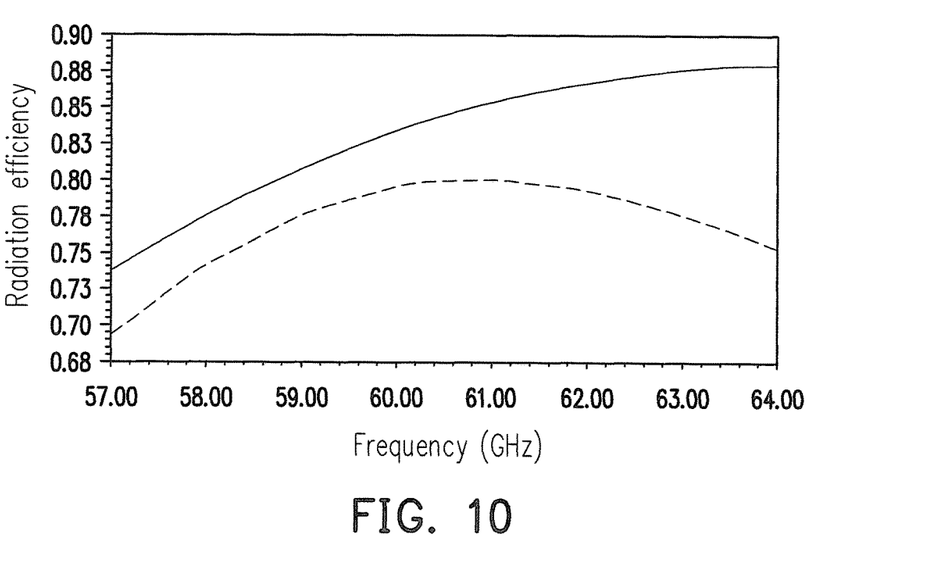
FIG. 10 shows the frequency response of the radiation efficiency for the millimeter-wave antenna.

FIG. 10 shows the frequency response of the radiation efficiency for the millimeter-wave antenna. According to the chip used and the design or the electrical requirements of the product, if the guide wavelength is D, the length of the through-hole may be designed to be one eleventh of the guide wavelength D (i.e. D/11). In FIG. 10, at 60 GHz, the gain of the antenna laterally feed-in with the wiring is 6.1 dBi and its radiation efficiency is 80% (dashed line), while the gain of the antenna vertically feed-in with the plated through-hole structure (the length of the through-hole is about D/11) is 6.3 dBi and its radiation efficiency is 83% (solid line), verifying the performance of the antenna is improved.

Also, as the chip may be embedded or buried in the substrate having the concave cavity or the opening, the overall thickness of the integrated chip package structure can be reduced. In addition, with respect to the package structure using wires or wiring connected to the antenna, one or more through-hole structures may be used to connect the antenna for the package structure of this disclosure, a smaller layout area is required to form the antenna and the performance of the antenna is even enhanced. The package structure of the disclosure effectively integrate the RF chip and the antenna pattern in the package, thereby lowering the millimeter-wave power loss and enhancing the performance of the module. As the antenna pattern is disposed above or below the position of the chip, and the plated through-hole structure(s) is used to connect the antenna pattern and the chip, the signal transmission path is shortened and the high frequency signal loss is reduced.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims and their equivalents.

What is claimed is:

1. An integrated millimeter-wave chip package structure, comprising:
   a first interposer structure, wherein the first interposer structure comprises a first metal layer, a second metal layer and an insulating support layer located between the first and second metal layers, and the first interposer structure includes at least one first plated through-hole structure, penetrating through the first metal layer, the insulating support layer and the second metal layer and electrically connecting the first metal layer and second metal layer;
   at least one chip, coupled to the first interposer structure, wherein the at least one chip has an active surface and contact pads located in the active surface of the at least one chip; and
   a first substrate, coupled to the first interposer structure, wherein the first substrate comprises at least one insulating layer and a third metal layer located on the at last one insulating layer, wherein the third metal layer is located on one side of the first substrate facing the first interposer structure, the first metal layer of the first interposer structure comprises at least one antenna pattern, the at least one antenna pattern is located above or below the at least one chip, the at least one chip is electrically connected to the at least one antenna pattern through the at least one first plated through-hole structure of the first interposer structure,
   wherein a portion of the at least one chip protrudes toward the first interposer structure from a surface of the first substrate facing the first interposer structure, and the active surface of the at least one chip is located between the surface of the first substrate and the first interposer structure.

2. The package structure of claim 1, wherein the first substrate has a concave cavity, the at least one chip is buried inside the concave cavity and the active surface of the at least one chip faces the second metal layer of the first interposer structure, the at least one chip is physically connected to the first interposer structure through bumps located between the contact pads and the second metal layer, and the at least one chip is electrically connected to the at least one antenna pattern through the bumps and the at least one first plated through-hole structure.

3. The package structure of claim 1, wherein the first substrate has an opening exposing the at least one chip, the active surface of the at least one chip faces the second metal layer of the first interposer structure, the at least one chip is physically connected to the first interposer structure through bumps located between the contact pads and the second metal layer, and the at least one chip is electrically connected to the at least one antenna pattern through the bumps and the at least one first plated through-hole structure.

4. The package structure of claim 2, wherein the first substrate comprises a fourth metal layer and a second plated through-hole structure, the fourth metal layer is located on an opposite side of the at least one insulating layer relative to the third metal layer, and the second plated through-hole structure penetrates through the first substrate to connect the third metal layer and the fourth metal layer located on two opposite sides of the at least one insulating layer.

5. The package structure of claim 3, wherein the first substrate comprises a fourth metal layer and the second plated through-hole structure, the fourth metal layer is located on an opposite side of the at least one insulating layer relative to the third metal layer, and the second plated through-hole structure penetrates through the first substrate to connect the third metal layer and the fourth metal layer located on two opposite sides of the at least one insulating layer.

6. The package structure of claim 4, further comprising a second substrate connected to the first substrate, the second substrate includes solder balls disposed between the first and second substrates, and the second substrate is physically and electrically connected to the first substrate through the solder balls.

7. The package structure of claim 5, further comprising a second substrate connected to the first substrate, the second substrate includes solder balls disposed between the first and second substrates, and the second substrate is physically and electrically connected to the first substrate through the solder balls.

8. The package structure of claim 2, further comprising a second interposer structure and bumps between the first interposer structure and the second interposer structure and between the first substrate and the second interposer structure, the second interposer structure includes at least one third plated through-hole structure penetrating through the second interposer structure, the second interposer structure is located between the at least one chip and the first interposer structure, and the at least one chip is connected to the second interposer structure through the bumps between the first substrate and the second interposer structure, the second interposer structure is connected to the first interposer structure through the bumps between the first interposer structure and the second interposer structure, and through the bumps between the first interposer structure and the second interposer structure and between the first substrate and the second interposer structure and the first and third plated through-hole structures, the at least one chip and the first and second interposer structures are physically and electrically connected.

9. The package structure of claim 3, further comprising a second interposer structure and bumps, the second interposer structure includes at least one third plated through-hole structure penetrating through the second interposer structure, the second interposer structure is located between the at least one chip and the first interposer structure, and the at least one chip is connected to the second interposer structure through the bumps, the second interposer structure is connected to the first interposer structure through the bumps, and through the first and third plated through-hole structures and the bumps, the at least one chip and the first and second interposer structures are physically and electrically connected.

10. The package structure of claim 8, wherein the first substrate comprises a fourth metal layer and a second plated through-hole structure, the fourth metal layer is located on an opposite side of the at least one insulating layer relative to the third metal layer, and the second plated through-hole structure penetrates through the first substrate to connect the third metal layer and the fourth metal layer located on two opposite sides of the at least one insulating layer.

11. The package structure of claim 9, wherein the first substrate comprises a fourth metal layer and the second plated through-hole structure, the fourth metal layer is located on an opposite side of the at least one insulating layer relative to the third metal layer, and the second plated through-hole structure penetrates through the first substrate to connect the third metal layer and the fourth metal layer located on two opposite sides of the at least one insulating layer.

12. The package structure of claim 10, further comprising a second substrate connected to the first substrate, the second substrate includes solder balls disposed between the first and second substrates, and the second substrate is physically and electrically connected to the first substrate through the solder balls.

13. The package structure of claim 11, further comprising a second substrate connected to the first substrate, the second substrate includes solder balls disposed between the first and second substrates, and the second substrate is physically and electrically connected to the first substrate through the solder balls.

14. The package structure of claim 1, wherein the first interposer structure further includes a wiring layer located in the insulating support layer and between the at least one antenna pattern and the second metal layer, and the wiring layer is a ground layer.

15. The package structure of claim 1, wherein the at least one chip is a radio frequency chip.

* * * * *